United States Patent [19]

Hom-ma et al.

[11] 4,208,257
[45] Jun. 17, 1980

[54] METHOD OF FORMING AN INTERCONNECTION

[75] Inventors: Yoshio Hom-ma, Hachioji; Hisao Nozawa, Hinodemachi; Akira Sato; Seiki Harada, both of Hachioji, all of Japan

[73] Assignee: Hitachi, Ltd., Japan

[21] Appl. No.: 708

[22] Filed: Jan. 3, 1979

[30] Foreign Application Priority Data

Jan. 17, 1978 [JP] Japan .................................. 53-2796

[51] Int. Cl.[2] .......................... C25F 3/02; C25F 3/14; C23C 15/00
[52] U.S. Cl. .............................. 204/129.65; 204/192 E
[58] Field of Search ............ 204/129.65, 129.1, 192 E, 204/192 EC

[56] References Cited

U.S. PATENT DOCUMENTS

| 3,560,357 | 2/1971 | Shaw | 204/129.65 |
| 3,984,300 | 10/1976 | Van Ommeren | 204/192 E |
| 4,004,044 | 1/1977 | Franco | 204/192 E |

Primary Examiner—T. M. Tufariello
Attorney, Agent, or Firm—Craig & Antonelli

[57] ABSTRACT

A lift-off layer made of a non-photosensitive resin or the like deposited on a substrate is put into a pattern inverse to an interconnection pattern by etching employing a molybdenum mask, a metal layer for interconnection metalization is formed on the whole area of the lift-off layer, and the molybdenum mask is removed by electrolytic etching, to simultaneously strip off and remove the metal layer overlying the mask, whereby an interconnection is formed. Thus, the interconnection can be formed in a much shorter time than in a prior-art lift-off technique.

16 Claims, 9 Drawing Figures

METHOD OF FORMING AN INTERCONNECTION

BACKGROUND OF THE INVENTION

1. Field of the Invention

This invention relates to a method of forming an interconnection of predetermined pattern on a substrate for interconnection metalization (hereinafter, termed "metalization substrate"). More particularly, it relates to a method of forming an interconnection of a predetermined pattern on a metalization substrate by a lift-off technology.

2. Brief Description of the Prior Art

First, a prior-art method of forming an interconnection based on the lift-off technology will be explained.

FIG. 1a illustrates a state in which a layer for lift-off 2 made of e.g. a polyimide resin is formed on a substrate 1 and a mask layer 3 made of chromium, aluminum or the like is formed thereon. The pattern of the mask layer is in a shape inverse to an interconnection pattern. Subsequently, as shown in FIG. 1b, the lift-off layer 2 is etched and processed into a shape conforming with the mask layer 3 by the use of an etching process such as e.g. RF sputter etching. Thereafter, metal layers for interconnection metalization 4a and 4b made of aluminum, copper, silicon or an alloy thereof are deposited. Further, as shown in FIG. 1c, the lift-off layer 2 underlying the mask is etched by using oxygen plasma 5 or the like. Simultaneously, the mask layer 3 and the overlying metal layer 4b are stripped off and removed. Then, a state shown in FIG. 1d is established, and an interconnection of the predetermined pattern is formed.

In such prior art, however, as shown in FIG. 1c, the area of the etched surface of the lift-off layer 2 is small, and the lateral distance to be etched is large. Therefore, a long time is required for removing the lift-off layer 2 with the oxygen plasma 5. By way of example, in the case of etching the lift-off layer 2 with the oxygen plasma, the rate at which the etching proceeds in the lateral direction is approximately 50 $\mu$m/hr under conditions of an oxygen pressure of 5 to 10 Torr and a radio-frequency power of 300 to 500 watts. If the width S of the lift-off layer 2 shown in FIG. 1b is 300 $\mu$m, it takes three hours to remove the lift-off layer. The exposure of the metal layer 4a to the oxygen plasma for the long period of three hours is unfavorable, not only in a low production efficiency, but also in the oxidation of the surface of the metal layer 4a, the production of a carbide or the occurrence of contamination attributed to the adhesion of a nonvolatile substance.

The following references are cited to show the state of the art: Japanese Patent Laying-open Specification No. 50-86984 and Japanese Patent Laying-open Specification No. 50-104870.

SUMMARY OF THE INVENTION

This invention has for its object to provide a method of forming an interconnection which overcomes the above-stated difficulty of the prior art that a long time is required for removing the lift-off layer 2, the mask layer 3 and the metal layer 4b overlying the mask layer 3, and which removes the mask layer 3 and the metal layer 4b on the lift-off layer 2 very quickly.

In order to accomplish the object, the method of forming an interconnection according to this invention comprises (i) the step of forming on a metalization substrate a mask made of molybdenum or a molybdenum alloy, (ii) the step of etching said metalization substrate with said mask, thereby to form depressions of predetermined pattern in a surface of said metalization substrate, (iii) the step of depositing a metal layer for interconnection metalization over the whole area of the surface of said metalization substrate, and (iv) the step of subjecting said mask to electrolytic etching, thereby to oxidize and dissolve out said mask and to strip off and remove the metal layer on said mask.

As the metalization substrate, there is used (i) any semiconductor substrate (including one in which elements are formed in its surface portion); (ii) a semiconductor substrate on which at least one insulating layer or silicon layer such as silicon dioxide layer, phospho-silicate glass layer, boro-silicate glass layer, a silicon nitride layer and a non-photosensitive polymer layer is formed; or (iii) an insulating substrate for interconnection metalization which is made of an insulating material, e.g. glass or silicon dioxide; or the like. That is, the metalization substrate may be a substrate for interconnection metalization at least one surface of which is made of one substance selected from the group consisting of silicon dioxide, phospho-silicate glass, boro-silicate glass, silicon nitride, silicon and a non-photosensitive polymer. Moreover, any substrate for interconnection metalization may be used insofar as at least one surface thereof is made of a material which is promptly etched by sputter etching or plasma etching.

As the non-photosensitive polymer, there is employed a polyimide resin, a polyimide isoindro-quinazolinedione resin (hereinafter, abbreviated to "PII resin"), cyclized rubber, a polyamide resin, a polyamide-imide resin, or the like. Any non-photosensitive polymer used for insulating a semiconductor device can be employed.

While the photoetching is usually employed for the formation of the mask in the step (i), plasma etching can also be employed. When molybdenum is used as the mask material, the etching is sometimes difficult to control on account of an excessively high etching rate. In such a case, the molybdenum alloy which contains at most about 10 weight-% of titanium or tungsten may be employed. The content of titanium or tungsten exceeding 10 weight-% is unfavorable because, when the substrate surface is washed with a fluoric acid solution, the metallic mask is dissolved or the cleaning of the substrate surface is liable to become impossible. A molybdenum layer or a molybdenum alloy layer for forming the mask is deposited by vacuum evaporation, sputtering, ion beam deposition, or the like. The thickness of the mask is preferably made 0.08 to 0.4 $\mu$m, and more desirably made 0.1 to 0.2 $\mu$m. When the thickness of the mask is less than 0.08 $\mu$m, pinholes increase, and when it is greater than 0.4 $\mu$m, the pattern precision is low. Both these cases are unfavorable.

For the etching of the metalization substrate in the step (ii), plasma etching or sputter etching is employed, and the latter is more desirable in point of the dimensional accuracy. Sputter etching and plasma etching are well known in the semiconductor device industries. As to the atmosphere of the etching, any can be used in the method of this invention insofar as it can be employed in case of etching a material constituting the surface of the metalization substrate.

The pattern of the depressions to be formed in the step (ii) corresponds to the interconnection pattern.

The material of the interconnection may be any metallic material which has heretofore been employed for micro-interconnections and which is sufficiently lower in the electrolytic etching rate than molybdenum, such as aluminum, copper, silicon, chromium, tungsten, gold and an alloy thereof.

In order to deposit the metal layer for interconnection metalization, a process employing a vapor is favorable. While vacuum evaporation is usually employed, laser deposition or sputtering, ion beam deposition or the like can also be employed.

The pattern of the interconnection may be in any shape as is needed. Ordinarily the height of the metal layer is made 0.3 to 2.2 $\mu$m, but this invention is not restricted to these values.

As an electrolyte for use in the electrolytic etching of the mask made of molybdenum or the molybdenum alloy, there is often employed an aqueous solution of oxalic acid, boracic acid, sulfamic acid, ammonium tetraborate, chromic acid, malonic acid, or the like; phosphoric acid; a solution with chromic acid or water mixed with phosphoric acid; or the like. In many cases, the concentration of the aqueous solution is set at 0.5 weight-% to the saturation concentration, and the current density is set at about 1 to 50 mA/cm$^2$. Regarding the anodic oxidation of molybdenum, however, many researchers have presented many electrolytic conditions.

Also in the interconnection forming method of this invention, any conditions may be relied on insofar as molybdenum or the molybdenum alloy undergoes the anodic oxidation and is quickly dissolved out. It is difficult to specifically restrict the electrolytic conditions such as the composition of the electrolyte, the temperature thereof and the current density for the electrolytic etching. Gold or platinum is often employed as the material of a cathode, but any material which fulfills the function as the cathode without being dissolved in the electrolyte may be used without being specifically restricted.

The metalization substrate having completed the step (iv) is provided with the metal layer of the predetermined pattern, and it can be put into practical use after depositing a protective film of SiO$_2$, phospho-silicate glass or the like thereon.

When the step (iv) has terminated, a portion which has underlain the removed mask protrudes beyond the depression formed in the step (ii) because it has not been etched in the step (ii). After the termination of the step (iv), the protrusive part of the metalization substrate is removed as a step (v) so as to bring the portion into substantial agreement with the level of the depression. Then, a structure is obtained in which the metal layer of the predetermined pattern exists on the substantially flat metalization substrate as shown in FIG. 1d. In removing the protrusive part, any etching method with which the etching rate of the protrusive part is sufficiently higher than that of the interconnection material may be employed. Although the plasma etching is ordinarily employed, the sputter etching may be employed. In case where the protrusive part is made of the polyimide resin or the PII resin, a wet type etching employing hydrazine hydrate may be used.

In the above, description has been made without especially restricting the metalization substrate. In case of a metalization substrate which has an insulating layer or a semiconductor layer such as silicon layer (serving as the lift-off layer), it is often the case that the insulating layer or the semiconductor layer is especially deposited on a substrate so as to be convenient for the formation of the interconnection and that the resultant substrate is employed as the metalization substrate in the step (i). In this case, the step of depositing the lift-off layer on the substrate is comprised before the step (i). As the lift-off layer, silicon dioxide, phospho-silicate glass, boro-silicate glass, silicon nitride, the non-photosensitive polymer, silicon, or the like is employed as already stated. Although the method of depositing the lift-off layer differs depending on the material, a well-known process may be used in any case. The thickness of the lift-off layer to be deposited is ordinarily made 0.3 to 2.2 $\mu$m for e.g. silicon dioxide or phospho-silicate glass. When it is less than 0.3 $\mu$m, pinholes increase, and when it is greater than 2.2 $\mu$m, cracks sometimes appear. In case of the non-photosensitive resin, the thickness is often made approximately 0.5 $\mu$m or greater. A thickness value less than 0.5 $\mu$m is unfavorable because of many pinholes. In general, the thickness of the lift-off layer to be deposited is made approximately equal to the thickness of the interconnection material or metal layer. When such a metalization substrate with the lift-off layer deposited on the substrate is used, the etching conditions of the substrate and the lift-off layer are often different. In such a case, only the lift-off layer can be selectively etched satisfactorily without damaging the substrate due to the etching of the lift-off layer.

In the step of electrolytic etching for the anodic oxidation and dissolution of the mask, an oxide film is often formed on the surface of the metal layer. The oxide film can be readily removed with an aqueous solution of sulfamic acid, or the like, and an interconnection having a clean surface is obtained.

According to the interconnection forming method of this invention as stated above, the period of time for removing the mask or the period of time for removing the unnecessary metal layer is very short, and the removal of the lift-off layer underlying the mask as is performed if necessary is speedy, so that the difficulty of the prior art has been eliminated. The reason for the quick removal of the lift-off layer underlying the mask is that, since the etching of the lift-off layer is carried out without the presence of the mask, the area of the etched surface becomes larger than in the prior art, the distance to be etched corresponding to the thickness of the lift-off layer and becoming noticeably shorter than in the prior art.

Other and further objects, features and advantages of the invention will appear more fully from the following description.

DESCRIPTION OF THE PRESENTLY PREFERRED EMBODIMENTS

Hereunder, this invention will be described more in detail in connection with embodiments.

Figure 1A:
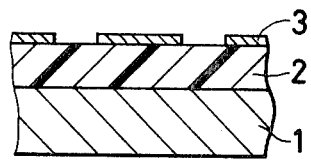
FIGS. 1a, 1b and 1d are sectional views for explaining some of the steps of methods of forming an interconnection according to a prior art and this invention.
Figure 1B:
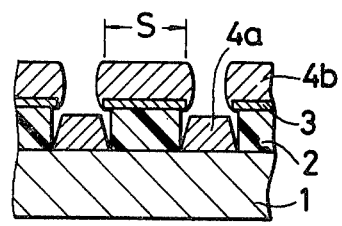
Figure 1C:
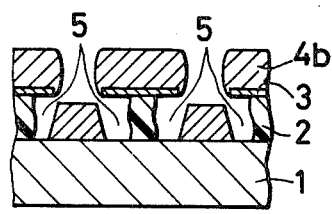
FIG. 1c is a sectional view for explaining the step of etching a lift-off layer in the prior-art method of forming an interconnection.
Figure 1D:
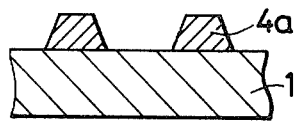
Figure 2A:
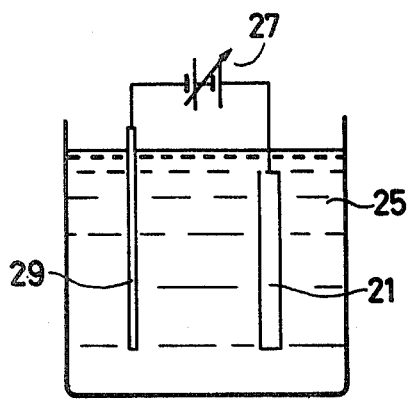
FIG. 2a is a schematic view of apparatus for use in an electrolytic etching in an embodiment of the method of forming an interconnection according to this invention.

Embodiment 1:

As shown in FIG. 1a, a PII resin ("PIQ" produced by Hitachi Kasei Kabushiki-Kaisha, "PIQ" is a registered trademark of this company) was formed to a thickness of 0.5–2.5 μm on a substrate 1 into a lift-off layer 2, molybdenum was evaporated thereon to a thickness of 0.08–0.3 μm, and a mask layer 3 having a pattern inverse to a predetermined interconnection pattern was formed by the photoetching. Subsequently, the lift-off layer 2 was etched and processed according to the mask layer 3 by the RF sputter etching. Further, aluminum 4a, 4b having a thickness of 0.3–2.2 μm was evaporated over the entire surface of the metalization substrate. This state is shown in FIG. 1b. As shown in FIG. 2a, the metalization substrate illustrated in FIG. 1b was immersed in an electrolyte 25 of a 4 weight-% aqueous solution of oxalic acid at a temperature of 24°–26° C. together with a counter electrode 29 made of platinum. Using the mask layer of the metalization substrate 21 as an anode and the counter electrode 29 as a cathode, a voltage of 3–5 V was applied with a variable voltage source 27, to carry out the electrolytic etching. Although an appropriate applied voltage differs depending on the electrolyte or the pattern configuration of the mask layer, it is ordinarily made 1–10 V. As the electrolyte, an aqueous solution which contains oxalic acid, sulfamic acid, chromic acid or the like and which is usually employed for the anodic oxidation of aluminum is generally used.

Figure 2D:
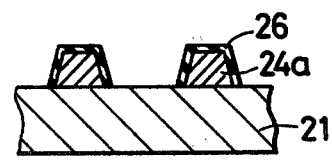
FIGS. 2c to 2e are sectional views for explaining some of the steps of the method of forming an interconnection according to this invention.
Figure 2B:
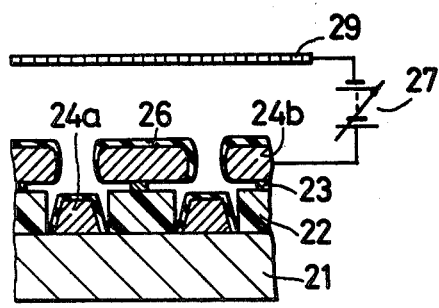
FIG. 2b is a schematic view for explaining the step of the electrolytic etching of a mask in an embodiment of the method of forming an interconnection according to this invention.

By the electrolytic etching, the mask layer of molybdenum 23 underlying the metal layer for interconnection metalization 24b was rapidly oxidized and dissolved into the electrolyte 25 as shown in FIG. 2b. Simultaneously, thin oxide films 26 were formed on the surfaces of the metal layers 24a and 24b. Accordingly, when the electrolytic etching was conducted for a predetermined time until the mask layer 23 was removed, the metal layer 24b was stripped off as seen from FIG. 2c. The rate of the oxidation and dissolution of the mask layer 23 by the electrolytic etching arrived at 75 μm/min, and the metal layer 24b which was so wide as to be 2 mm at the maximum could be removed by the electrolytic etching for 15 minutes. The lift-off layer 22 could be easily removed merely by exposing it to an oxygen plasma for 5–15 minutes, and an interconnection as shown in FIG. 2d was formed.

As set forth above, according to the interconnection forming method of this invention, the interconnection could be formed in a period of time which was about 1/10 of that in the prior art or shorter.

The oxide film 26 formed on the surface of the metal layer 24a at the time of the electrolytic etching can be readily removed with an aqueous solution of sulfamic acid if necessary. It was removed, and the interconnection having a clean surface could be obtained.

Figure 2E:
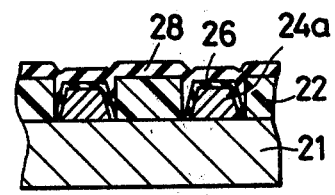
Figure 2C:
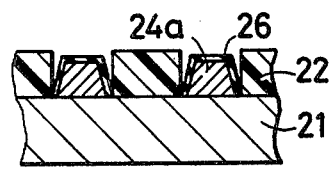

Embodiment 2:

An interconnection as shown in FIG. 2c was formed on a metalization substrate under the same conditions as in Embodiment 1 except that SiO2 or phospho-silicate glass which had a thickness of 0.3–2.2 μm being substantially equal to the thickness of metal layers for interconnection metalization 24a and 24b was employed as a lift-off layer 22, that sputter etching whose atmosphere was a gaseous mixture consisting of freon gas and helium was employed for the etching of the lift-off layer, and that 5 weight-% aqueous solution of sulfamic acid was used as an electrolyte. The rate of oxidation and dissolution of the mask layer 23 was about ½ of that in the case of Embodiment 1. On the metalization substrate of the structure illustrated in FIG. 2c, a protective film 28 made of SiO2, phospho-silicate glass or the like was further formed by the CVD process. Then, an interconnection as shown in FIG. 2e was obtained.

Even in case where a Mo-Ti alloy or a Mo-W alloy which contained 1 weight-% of titanium, 5 weight-% of titanium, 10 weight-% of titanium, 1 weight-% of tungsten, 5 weight-% of tungsten of 10 weight-% of tungsten was employed as the material of the mask layer 23, the same result as in the above embodiment was obtained except that the rate of the etching for forming the pattern of the mask layer 23 lowered.

Obviously many modifications and variations of the present invention are possible in the light of the above teachings. It is therefore to be understood that within the scope of the appended claims the invention may be practiced otherwise than as specifically described.

What is claimed is:

1. A method of forming an interconnection comprising (i) the step of forming on a metalization substrate a mask made of molybdenum or a molybdenum alloy, (ii) the step of etching an exposed surface of said metalization substrate, thereby to form depressions of predetermined pattern in the exposed surface of said metalization substrate, (iii) the step of depositing a metal layer for interconnection metalization onto the etched surface of said metalization substrate and onto said mask, and (iv) the step of subjecting said mask to electrolytic etching, thereby to oxidize and dissolve out said mask and to strip off and remove the metal layer deposited on said mask.

2. A method of forming an interconnection as defined in claim 1, characterized by employing in the step (i) the metalization substrate at least one surface of which is made of a substance selected from the group consisting of silicon dioxide, phospho-silicate glass, boro-silicate glass, silicon nitride, silicon, and a non-photosensitive polymer.

3. A method of forming an interconnection as defined in claim 1, characterized by employing in the step (i) the metalization substrate at least one surface of which is made of a non-photosensitive polymer.

4. A method of forming an interconnection as defined in claim 3, characterized in that said non-photosensitive polymer is a substance selected from the group consisting of a polyimide resin, a polyimide isoindro-quinazolinedione resin, cyclized gum, a polyamide resin, and a polyamide-imide resin.

5. A method of forming an interconnection as defined in claim 1, characterized in that in the step (i), the mask made of molybdenum is formed.

6. A method of forming an interconnection as defined in claim 1, characterized in that in the step (i), the mask made of the molybdenum alloy which contains at most about 10 weight-% of titanium or tungsten is formed.

7. A method of forming an interconnection as defined in claim 1, characterized in that in the step (ii), sputter etching or plasma etching is employed for the etching of said metalization substrate.

8. A method of forming an interconnection as defined in claim 1, characterized in that in the step (iv), an aqueous solution of a substance selected from the group consisting of oxalic acid, boracic acid, sulfamic acid, ammonium tetraborate, chromic acid, and malonic acid is employed as an electrolyte for the electrolytic etching.

9. A method of forming an interconnection as defined in claim 1, characterized in that in the step (iv), an electrolyte selected from the group consisting of phosphoric acid, an aqueous solution of phosphoric acid, and a mixed aqueous solution of phosphoric acid and chromic acid is employed as the electrolyte for the electrolytic etching.

10. A method of forming an interconnection as defined in claim 1, characterized by including after the step (iv), (v) the step of removing a part of said metalization substrate having underlain said mask and bringing a level of this part into agreement with that of the depression formed in the step (ii).

11. A method of forming an interconnection as defined in claim 10, characterized in that in the step (v), the part of said metalization substrate having underlain said mask is removed by plasma etching or sputter etching.

12. A method of forming an interconnection as defined in claim 1, characterized by including before the step (i) the step of depositing a lift-off layer made of an insulating material or a semiconductor material on a substrate and thus manufacturing said metalization substrate said lift-off layer being etched in step (iii) to form the predetermined pattern therein.

13. A method of forming an interconnection comprising (i) the step of forming on a metalization substrate a mask made of molybdenum or a molybdenum alloy, said substrate having a surface formed of a substance that can be etched by sputter etching or plasma etching, (ii) the step of sputter or plasma etching an exposed surface of said metalization substrate thereby to form a predetermined pattern in the exposed surface of said metalization substrate, (iii) the step of depositing a metal layer for interconnection metalization onto the etched and exposed surface of said metalization substrate and onto said mask, and (iv) the step of subjecting the mask to electrolytic etching thereby to remove the mask and to allow removal of the metal layer deposited on said mask.

14. A method of forming an interconnection comprising (i) the step of depositing a lift-off layer made of an insulating material or of a semiconductor material on a substrate, (ii) the step of forming on said lift-off layer a mask made of molybdenum or a molybdenum alloy, (iii) the step of etching an exposed surface of said lift-off layer thereby to form depressions of a predetermined pattern that extend to a surface of said substrate, (iv) the step of depositing a metal layer for interconnection metalization onto the surface of said substrate and onto to said mask, and (v) the step of subjecting said mask to electrolytic etching thereby to oxidize and dissolve out said mask and to allow removal of the metal layer deposited on said mask.

15. A method of forming an interconnection as defined in claim 14, characterized by including after step (iv), (v) the step of removing the remaining portion of said lift-off layer by etching.

16. A method of forming an interconnection as defined in claim 15, characterized in that lift-off layer is made of a substance selected from the group consisting of silicon dioxide, phospho-silicate glass, boro-silicate glass, silicon nitride, silicon and a non-photosensitive polymer, and said lift-off layer is etched by sputter etching or plasma etching.

* * * * *